United States Patent
Chahabadi

[11] Patent Number: 5,915,028
[45] Date of Patent: Jun. 22, 1999

[54] AMPLITUDE DEMODULATOR

[75] Inventor: Djahanyar Chahabadi, Hildesheim, Germany

[73] Assignee: Robert Bosch GmbH, Stuttgart, Germany

[21] Appl. No.: 08/809,739

[22] PCT Filed: Sep. 8, 1995

[86] PCT No.: PCT/DE95/01227

§ 371 Date: May 13, 1997

§ 102(e) Date: May 13, 1997

[87] PCT Pub. No.: WO96/10290

PCT Pub. Date: Apr. 4, 1996

[30] Foreign Application Priority Data

Sep. 27, 1994 [DE] Germany .............. 44 34 451

[51] Int. Cl.[6] .................................................. H04H 5/00
[52] U.S. Cl. .......................... 381/15; 381/16; 455/337; 329/347; 329/348; 375/261
[58] Field of Search ........................ 381/15, 16; 375/261, 375/268, 298, 300, 320; 329/304, 306, 347, 348, 363, 337; 455/324

[56] References Cited

U.S. PATENT DOCUMENTS

| 4,236,042 | 11/1980 | Leitch ...................................... 329/348 |
| 4,893,316 | 1/1990 | Jane et al. .................................. 375/44 |
| 5,222,144 | 6/1993 | Whikehart ................................. 348/15 |
| 5,291,525 | 3/1994 | Funderburk et al. ...................... 375/98 |
| 5,561,716 | 10/1996 | Kasser et al. ............................. 381/15 |
| 5,586,147 | 12/1996 | Kreuzgruber et al. .................. 329/304 |
| 5,592,557 | 1/1997 | Chahabadi et al. ....................... 381/10 |
| 5,606,619 | 2/1997 | Chahabadi et al. ....................... 381/13 |
| 5,614,862 | 3/1997 | Sun .......................................... 455/337 |
| 5,631,963 | 5/1997 | Herrmann ................................. 381/13 |
| 5,661,433 | 8/1997 | LaRosa et al. ........................... 455/337 |
| 5,661,809 | 8/1997 | Chahabadi et al. ....................... 381/10 |
| 5,661,810 | 8/1997 | Chahabadi et al. ....................... 381/10 |
| 5,673,324 | 9/1997 | Kasser et al. ............................. 381/13 |
| 5,706,350 | 1/1998 | Ogawa et al. ............................ 381/15 |
| 5,732,068 | 3/1998 | Takahashi et al. ....................... 375/261 |
| 5,754,591 | 5/1998 | Samueli et al. .......................... 375/261 |
| 5,767,739 | 6/1998 | Witte ....................................... 375/261 |

FOREIGN PATENT DOCUMENTS 2099265 12/1982 United Kingdom ..................... 381/15

*Primary Examiner*—Paul Loomis
*Assistant Examiner*—Xu Mei
*Attorney, Agent, or Firm*—Keyon & Keyon

[57] ABSTRACT

An amplitude demodulator for demodulating a quadrature-amplitude modulated stereo signal for radio receivers, where a digital intermediate-frequency signal is constructed from a received signal, the intermediate-frequency signal is converted into a baseband, creating two orthogonal components thereby, a magnitude signal and a phase signal are derived from the orthogonal components, a tangent is constructed from the phase signal, and the tangent is multiplied by the magnitude signal to create a stereo difference signal.

8 Claims, 11 Drawing Sheets

AMPLITUDE DEMODULATOR

FIELD OF THE INVENTION

The present invention concerns a method of demodulating a quadrature-amplitude modulated stereo signal for radio receivers.

BACKGROUND INFORMATION

The object of the present invention is a method of amplitude-demodulation for radio receivers. Since such receivers are usually executed in digital technology, a digitally realized amplitude demodulator can make use of the timing signals present in the receiver.

SUMMARY OF THE INVENTION

A digital radio receiver for quadrature-amplitude demodulated signals is known from European Patent Application Number A 0 540 195. The received signal is digitalized and, in an initial stage of the circuity, blended and filtered and its sampling rate decreased, whereupon in-phase and quadrature components of the signal leave through an output terminal. Envelope detection and elimination of the direct component leaves the stereo sum signal (L+R), and the stereo difference signal (L–R) is generated by renewed blending and quadrature-amplitude modulation and conversion.

One advantage of the amplitude demodulator in accordance with the present invention is that the reference frequency does not need to be coupled to the frequency of the unmodulated carrier when matched if amplitude-modulation stereo broadcasts that employ a quadrature-amplitude modulated carrier are received. Such coupling is known for example from IEEE Transactions on Consumer Electronics, Vol. 40, No. Feb. 1, 1994, pages 64 to 74.

A particular feature of one embodiment of the present invention is that the phase signal can be corrected prior to construction of the tangent when there are deviations in frequency and phase in the intermediate frequency that has been converted into the baseband. Frequency is accordingly corrected by open loop control instead of closed loop control (PLL).

Frequency deviations can be advantageously corrected by subtracting from the phase signal a correction signal derived by measuring variations over time in the phase signal, subsequent low-pass filtering, and integration of the low-pass filtered signal.

In another embodiment of the present invention a correction signal can be derived by frequency-correcting and low-pass filtering a phase signal and subtracting the result from a phase signal that has already been corrected for frequency deviations.

Still another correction signal can in one embodiment of the present invention be constructed by obtaining the magnitude of and low-pass filtering a phase signal that has already been corrected for frequency deviations. A downstream threshold circuit supplies hysteresis. This third correction signal can then be added to a phase signal that has already been corrected for frequency deviations. Since phase angle is limited to between $-\pi$ and $+\pi$ in the arithmetic stage that computes the magnitude signal and the phase signal, the third correction signal can assume two different levels representing phase deviations of $\pi$.

Still another advantageous way of deriving the stereo difference signal from the phase signal according to the present invention is by low pass filtering the stereo difference signal to obtain a feedback signal, low pass filtering the signal that characterizes the variations in the phase signal over time, adding these two low pass filtered signals, adding the resulting signal to a phase signal that has been corrected for frequency deviations, and routing the resulting signal through a limiter in order.

Since the direct component depends in this event only on phase error, the nonlinear-distortion factor is particularly low.

DETAILED DESCRIPTION OF THE INVENTION

Although all embodiments and components are depicted herein in the form of block diagrams, the circuitry in accordance with the present invention is not to be construed as being limited to forms that can be constructed from such modules only. The circuitry in accordance with the present invention can in fact be realized with particular practicality from highly integrated circuits. A digital signal processor can be appropriately programmed for example to carry out the processing steps illustrated in the diagrams. The circuitry in accordance with the present invention can constitute essential components of a radio receiver in conjunction with other circuitry in an integrated circuit.

Figure 1:
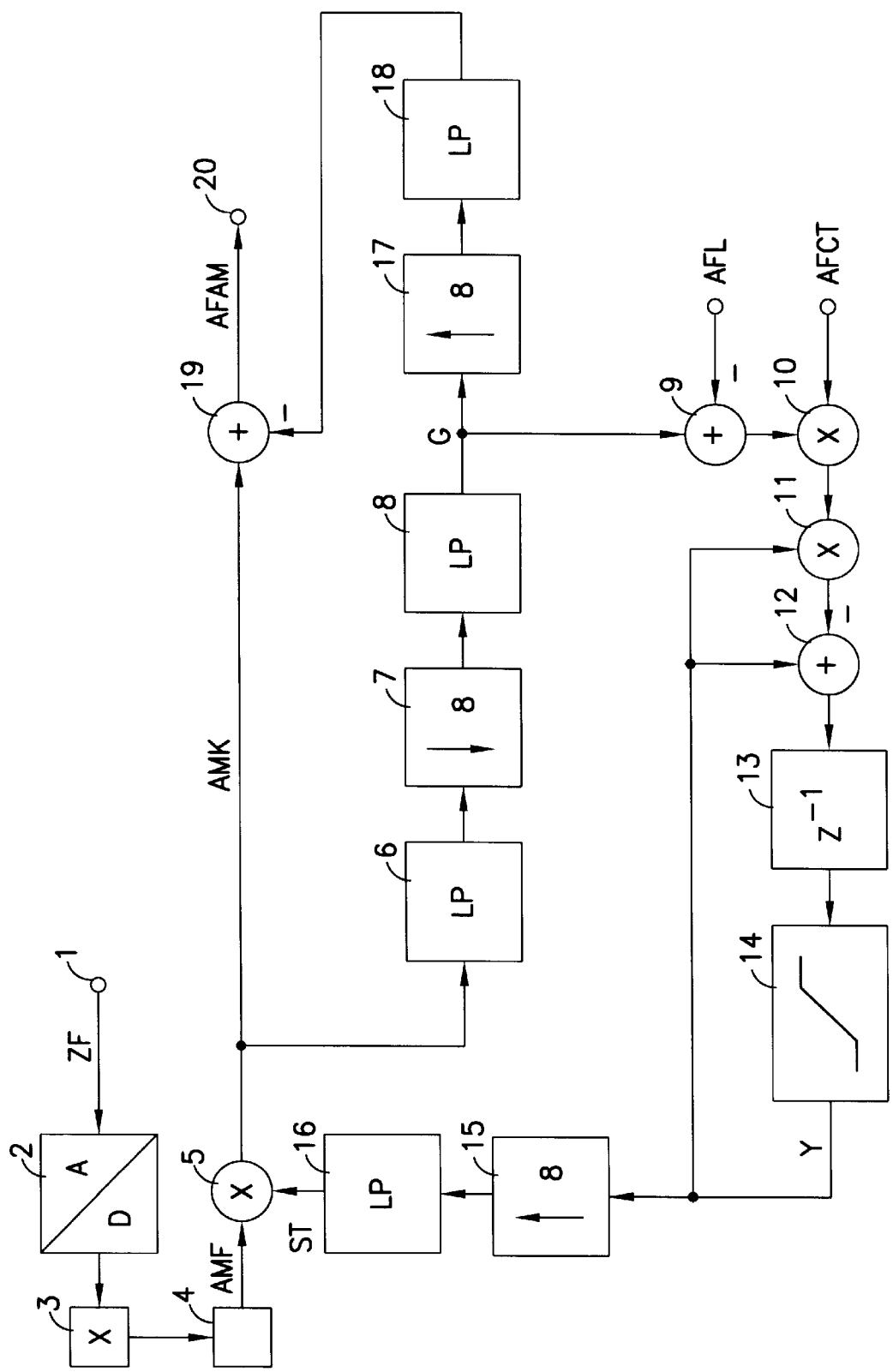
FIG. 1 illustrates an embodiment of the present invention intended for monophonic reception.

An intermediate-frequency signal ZF enters the amplitude demodulator illustrated in FIG. 1 through its input terminal 1. The signal is sampled at a frequency of 14.25 MHZ and converted into a digital intermediate-frequency signal in an analog-to-digital converter 2. The digital intermediate-frequency signal is blended into the baseband and demodulated in a downstream mixer 3. It is sometimes practical in this event to decrease the original sampling rate of 14.25 MHZ to a frequency, 45.6 KHz for instance, appropriate for processing the low-frequency signal further. The signal leaving the amplitude demodulator includes, aside from a low-frequency utilization information, a direct component that derives from the amplitude of the unmodulated amplitude-modulation carrier. The amplitude of the signal AMF leaving the demodulator is also dependent thereon. This dependence is compensated in a multiplier 5 that multiplies signal AMF by a manipulated variable ST obtained as will be specified hereinafter from the direct component of signal AMF.

The direct component is derived by low-pass filtering the signal leaving multiplier 5. Since the direct component needs to be low-pass filtered with narrow-band filtering and since closed loop control will accordingly not address the low-frequency components of the low-frequency signal, the threshold frequency needs to be low. The signal AMK leaving multiplier 5 is initially filtered in a low-pass filter 6, its sampling rate is reduced eightfold in a block 7, and it is filtered again in another low-pass filter 8. The direct component G leaving low-pass filter 8 is initially subjected for purposes of control to level-constant and time-constant adjustment. A subtractor 9 supplies a level-correction value AFL for correcting the level and a multiplier 10 supplies a factor AFCT for correcting the time constant.

The accordingly processed direct component is converted into manipulated variable ST by a gradient procedure. The direct component is forwarded for this purpose through another multiplier 11 and another subtractor 12 to a device 13 that delays direct component G by one sampling period. Just downstream of direct-component delaying device 13 is a limiter 14. The signal Y leaving limiter 14 is limited at each side. The purpose of limiter 14 is to establish the range of levels that are to be excluded. Limiter 14 can also be positioned upstream of direct-component delaying device 13. The limited but not delayed signal can also be employed as a manipulated variable.

The signal Y leaving the limiter is interpolated and low-pass filtered in stages 15 and 16 to increase the sampling rate, and forwarded in the form of manipulated variable ST to multiplier 5.

To relieve it of signal AMK, direct component G is forwarded through an interpolation stage 17 and a low-pass filter 18 to a subtractor 19. The demodulated low-frequency signal AFAM leaves through the output terminal 20 of subtractor 19.

The embodiments the present invention the present invention illustrated in FIG. 2 through 19 allow reception of stereophonic signals transmitted by quadrature-amplitude modulation.

Figure 2:
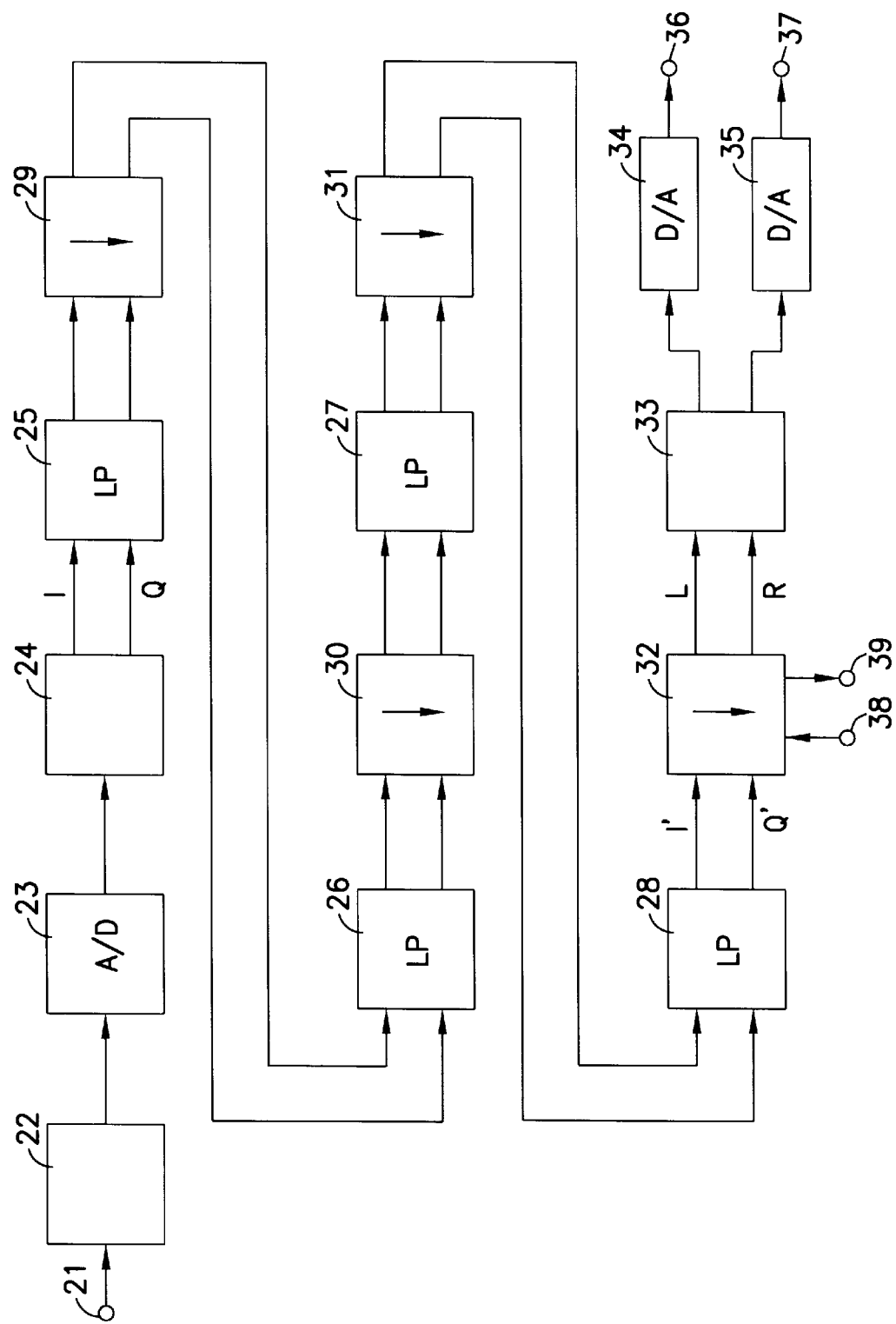
FIG. 2 illustrates an embodiment of the present invention intended for stereophonic reception.

An analog intermediate-frequency signal enters the circuitry illustrated in FIG. 2 through its input terminal 21. The signal is forwarded to a sampling-and-holding circuit 22 to an analog-to-digital converter 23. The analog-to-digital converter's output terminal communicates with a mixer 24 that employs a known process to blend the digital intermediate-frequency signal with two different orthogonal signals, resulting in components I and Q. The signal is low-pass filtered and its sampling rate reduced in four steps by a filter 25 and a decimation stage 29, a second filter 26 and a second decimation stage 30, a third filter 27 and a third decimation stage 31, and a fourth filter 28.

Decimation stage 29 reduces the sampling rate of the digital intermediate-frequency signal to 456000 1/sec, decimation stage 30 to 228000 1/sec, and decimation stage 31 to 45600 1/sec. Low-pass filter 28 eliminates the adjacent channels' wanted and unwanted signals from the operating channel's complex baseband signal.

The resulting components I' and Q' are forwarded to a stereo demodulator 32 that will be specified hereinafter with reference to FIG. 3. The audio signals L and R deriving from the demodulator's output terminal are forwarded through a circuit 33 for audio processing and through digital-to-analog converters 34 and 35 to output terminals 36 and 37. Audio-processing circuit 33 can include loudness and tone adjustments.

A mono-to-stereo conversion signal enters stereo demodulator 32 through an input terminal 38. A signal called the pilot-tone indicator, which represents the pilot tone, leaves through output terminal 39.

Figure 3:
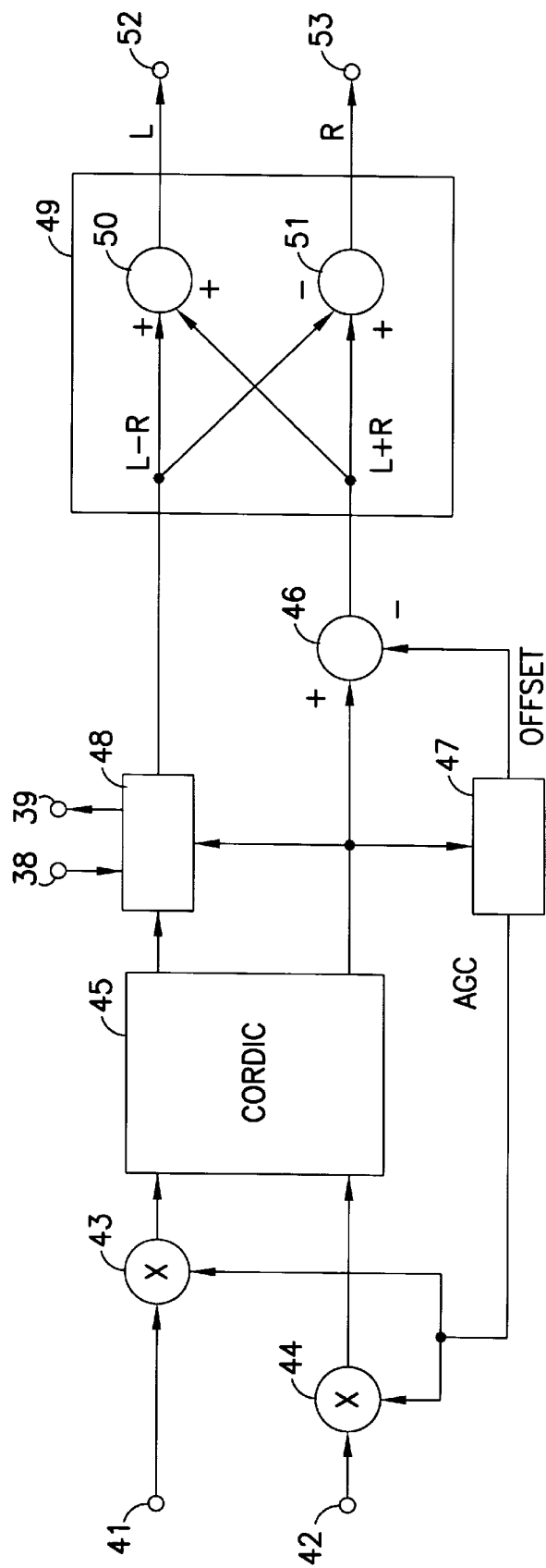
FIG. 3 shows a detailed illustration of the stereo-demodulation part of the circuitry of FIG. 2.

FIG. 3 is a detailed illustration of the stereo demodulator illustrated in FIG. 2. Real component I enters through input terminal 41 and arrives at a multiplier 43. Imaginary component Q' enters through input terminal 42 and arrives at a multiplier 44. The components' dynamics are regulated in the multipliers by an AGC signal. The regulated signals are forwarded to the input terminals of an arithmetic stage 45 that constructs a CORDIC algorithm. The results are a signal B that represents magnitude and a signal P that represents phase. Magnitude signal B comprises a sum signal L+R and a direct component. The direct component is obtained by blending the carrier signal to frequency 0. Phase signal is a combination of a difference signal L−R, the pilot tone, and a sum signal. The sum signal is subtracted from the direct component in a subtractor 46. An offset signal and an AGC signal are derived from the direct component in a regulating circuit 47. The direct component can also be employed for mono-to-stereo overblending and to create a search-and-stop function for controlling the transmission search. This feature is not illustrated in FIG. 3.

A Q decoder 48 for phase signal P generates a difference signal L−R. Signal L−R is forwarded along with sum signal L+R (without the direct component) to a matrix 49. Matrix 49 comprises an adder 50 and a subtractor 51. Signal L leaves through the matrix's output terminal 52 and signal R through its output terminal 53. A mono-to-stereo switching signal can enter Q decoder 48 through input terminal 38. The pilot-tone indicator can be obtained from output terminal 39.

Figure 4:
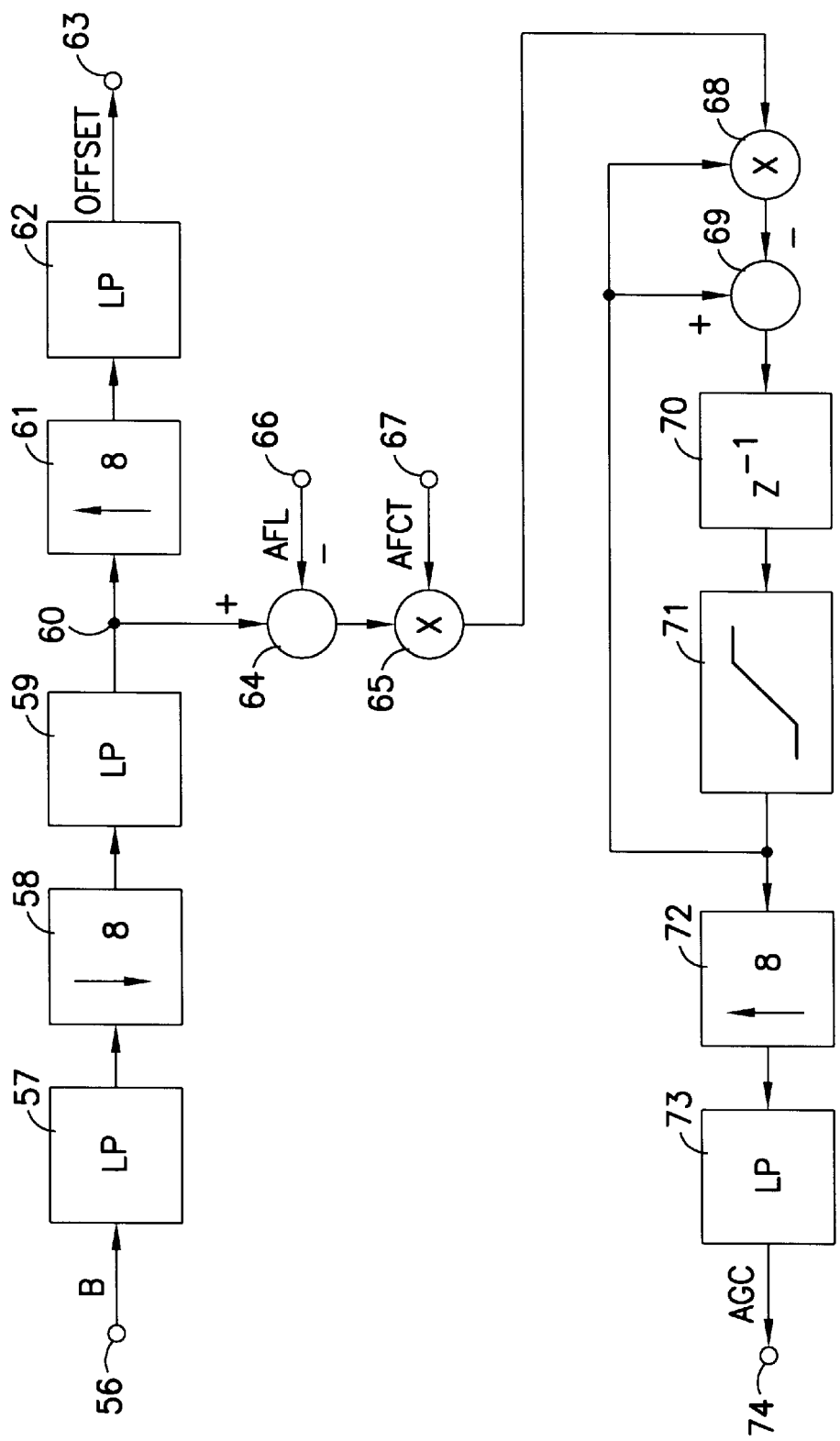
FIG. 4 illustrates the regulating circuit according to the present invention illustrated in FIG. 3.

FIG. 4 is a detailed illustration of the regulating circuitry 47 illustrated in FIG. 3. Magnitude signal B enters through input terminal 56 at a sampling rate 45600 Hz. It is filtered through a low-pass filter 57 and reduced by a factor of 8 to 5700 Hz in a decimator 58. Another low-pass filter 59 suppresses the sum signal, and only the direct component remains at junction 60. The sampling rate is now restored by a factor of 8 in a stage 61 and the signal is forwarded to a low-pass filter 62 that emits an offset signal. The offset signal leaves through the output terminal 63 of the subtractor 46 illustrated in FIG. 3. The sampling-rate decimation and subsequent restoration allow the low-pass filtering necessary for constructing the offset signal to be carried out at a lower threshold frequency and with a less complicated filter 59.

The signal representing the direct component is forwarded from junction 60 through a subtractor 64 and a multiplier 65 to generate an AGC signal. An AFL signal enters subtractor 64 through an input terminal 66. The AFL signal is employed to establish a reference level for dynamics regulation. An AFCT signal enters through another input terminal 67 to establish the dynamics-regulation time constants. The direct component signal is subjected with its direct component and amplitude accordingly modified to processing by the gradient method in the subsequent circuits. The AGC signal is pursued until the desired level establishes itself.

The direct component is for this purpose forwarded by way of another multiplier 68 and another subtractor 69 to a device that decelerates it by one sampling period. Just downstream of delaying device 70 is a limiter 71. The signal leaving limiter 71 is limited at each side. The purpose of the limiter is to establish the range to be leveled. Limiter 71 can alternatively be upstream of the delay device. An undelayed but limited signal can also be employed as a manipulated variable.

The signal leaving limiter 71 is then interpolated at stage 72 and low-pass filtered through a filter 73 to restore the sampling rate and supplied in the form of a manipulated variable AGC to the multipliers 43 and 44 illustrated in FIG. 3.

Figure 5:
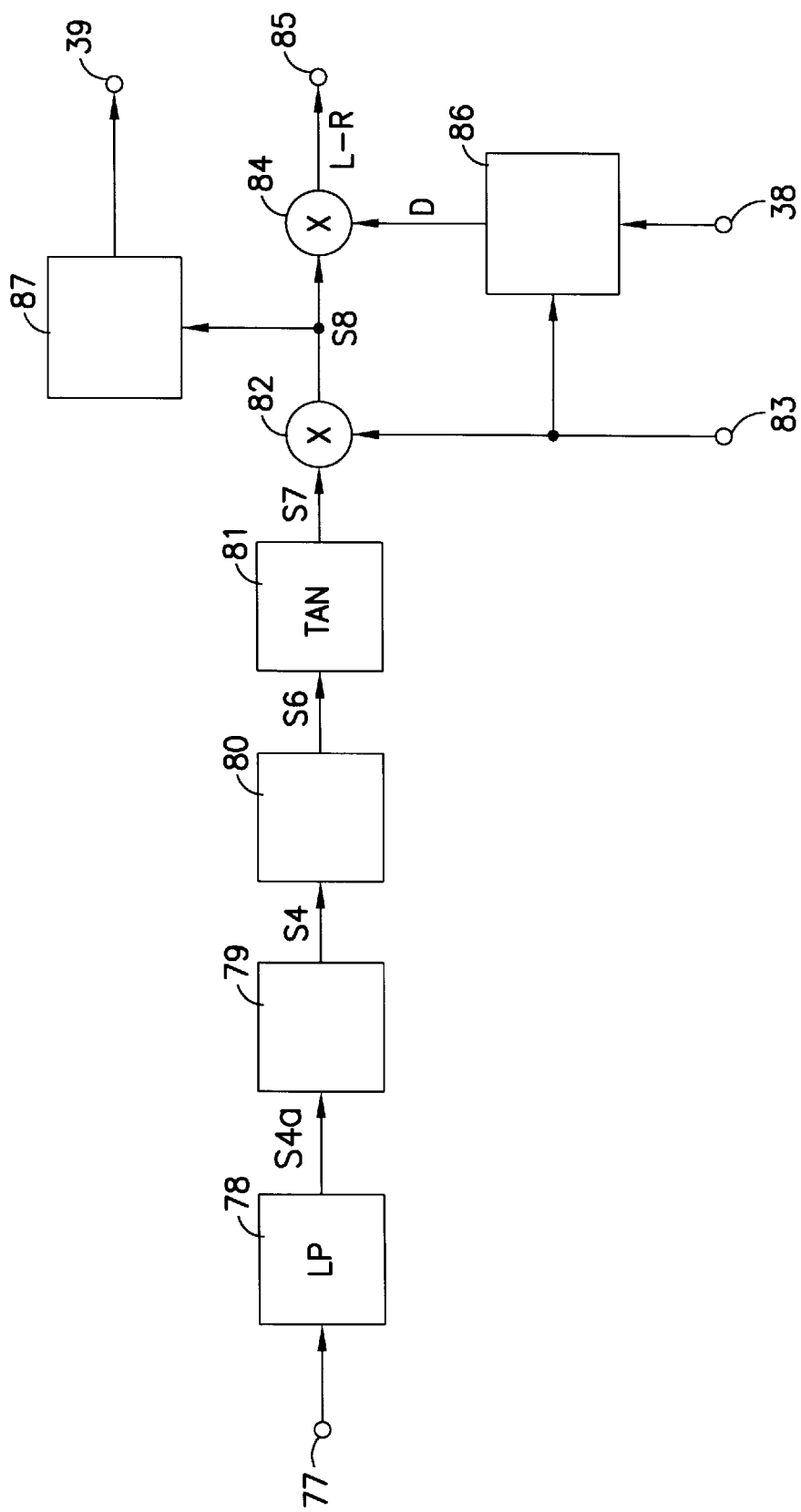
FIG. 5 illustrates a component for decoding the phase component of an intermediate-frequency signal that has been demodulated with respect to magnitude and phase according to an embodiment of the present invention.

The circuit components specified previously are also needed for demodulating monophonic signals. For stereo signals the Q decoder 48 illustrated in FIG. 3 provides a difference signal L–R. FIG. 5 illustrates one example of a Q decoder. A phase signal leaving the arithmetic stage 45 illustrated in FIG. 3 enters through input terminal 77. The signal encounters three correction stages, specifically a frequency-correction circuit 78, a π-correction circuit 79, and a phase-correction circuit 80. These stages are necessary because the receiver in accordance with the present invention is tuned to a reference frequency obtained from a quartz timer and will generally not agree precisely with the transmitter's unmodulated carrier frequency. The point of departure will accordingly be a center-frequency error of as much as a few hundred hertz, and the phase signal P will initially need to be subjected to frequency, π, and phase correction in that order.

Figure 9:
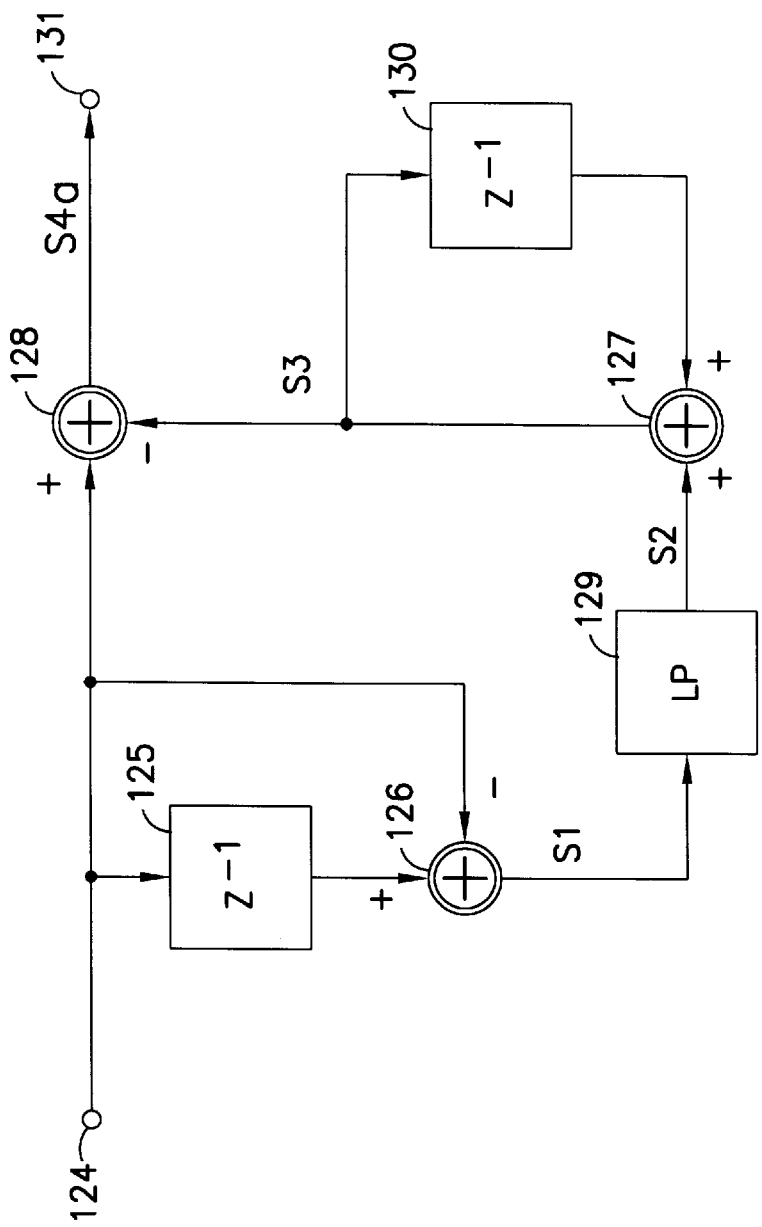
FIG. 9 illustrates a circuit for correcting frequency errors of an intermediate frequency signal according to an embodiment of the present invention.
Figure 10:
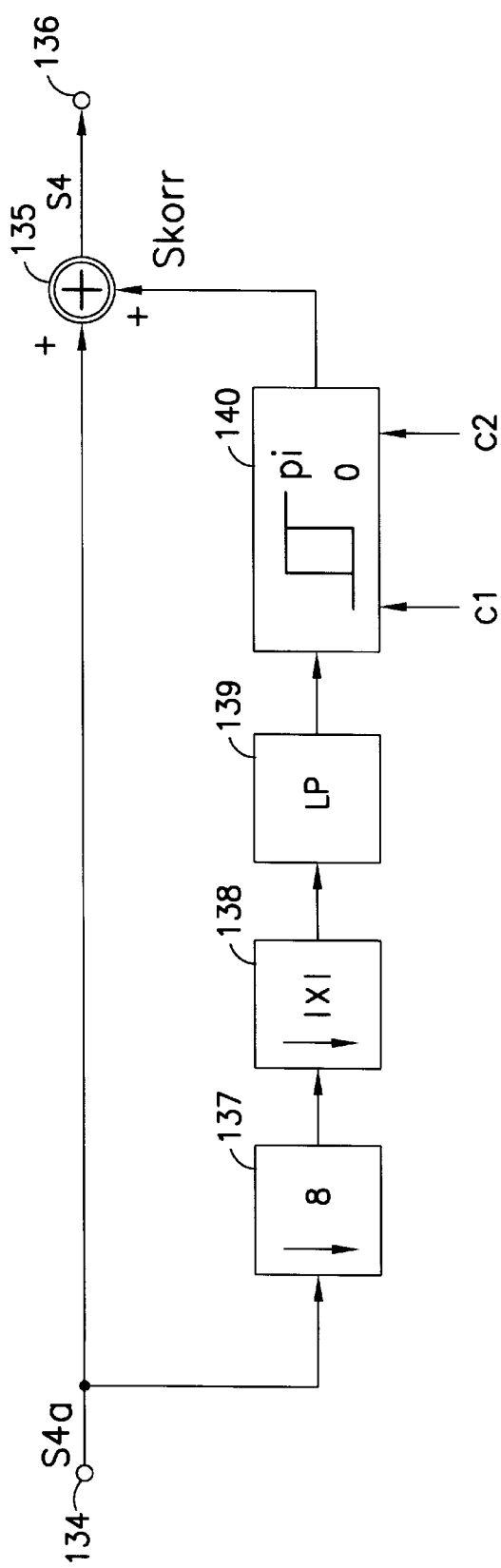
FIG. 10 illustrates a correction circuit according to an embodiment of the present invention.
Figure 11:
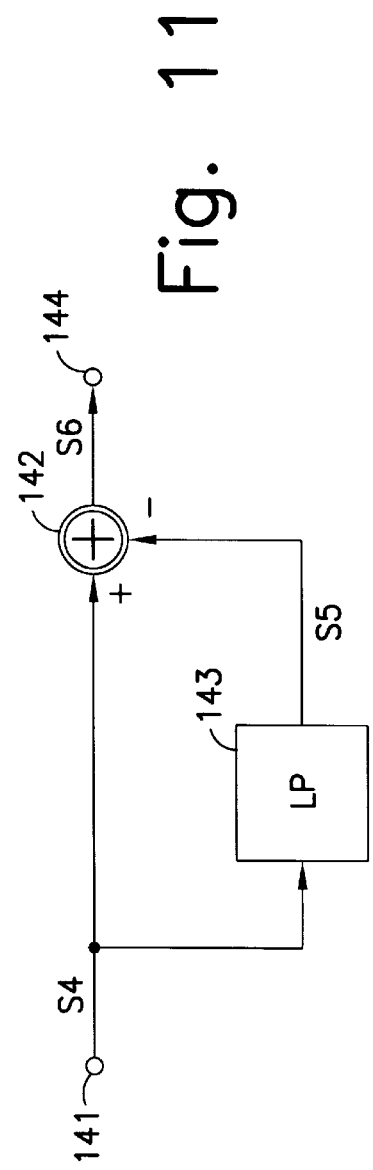
FIG. 11 illustrates circuitry for detecting and correcting phase errors in a signal according to an embodiment of the present invention.

FIG. 9 illustrates frequency-correction circuit 78, FIG. 10 π-correction circuit 79, and FIG. 11 phase-correction circuit 80, in detail. The tangent of the accordingly corrected phase signal is constructed in a stage 81. The resulting signal S7 is multiplied in a stage 82 by the magnitude signal B arriving from input terminal 83. The resulting signal S8 essentially corresponds to difference signal L–R. Signal S8 is multiplied in a multiplier 84 by a signal D to separate the channels and leaves through an output terminal 85. It is then forwarded to the matrix 49 illustrated in FIG. 3.

Signal D is generated in a circuit 86, characterizes the quality of the received signal, and depends on the mono-to-stereo switching signal and on magnitude signal B. In a manually obtainable state, the mono-to-stereo switching signal ensures that the signal and hence difference signal L–R are 0. Signal D can depend on magnitude signal B such that the magnitude signal is integrated over a longer period of time and such that D is accordingly smaller the farther the integrated magnitude signal B lies below a prescribed threshold, since the point of departure can then also be a poor signal-to-noise ratio.

The signal leaving multiplier 82 also contains the pilot tone. The pilot-tone indicator is derived from the pilot tone in a pilot-tone filter 87 at output terminal 39.

Figure 6:
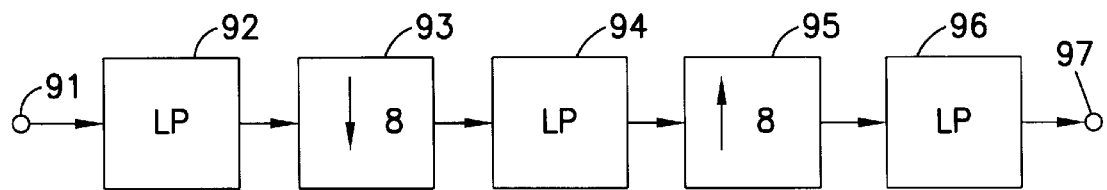
FIG. 6 illustrates one embodiment of a low-pass filter according to the present invention employed in the circuit illustrated in FIG. 2.

The circuits 78 and 80 illustrated in FIG. 5 require low-pass filters with a very low threshold frequency. FIG. 6 illustrates an appropriate design. The signal to be filtered enters through an input terminal 91 and travels through a low-pass filter 92, a sampling-rate decimator 93, another low-pass filter 94, and an interpolator that restores the scanning rate, and still another low-pass filter 96. The filtered signal leaves through an output terminal 97. Low-pass filters 92 and 96 are comb filters, whereas low-pass filter 94 is a chain of IIR filters of the first order.

Figure 7:
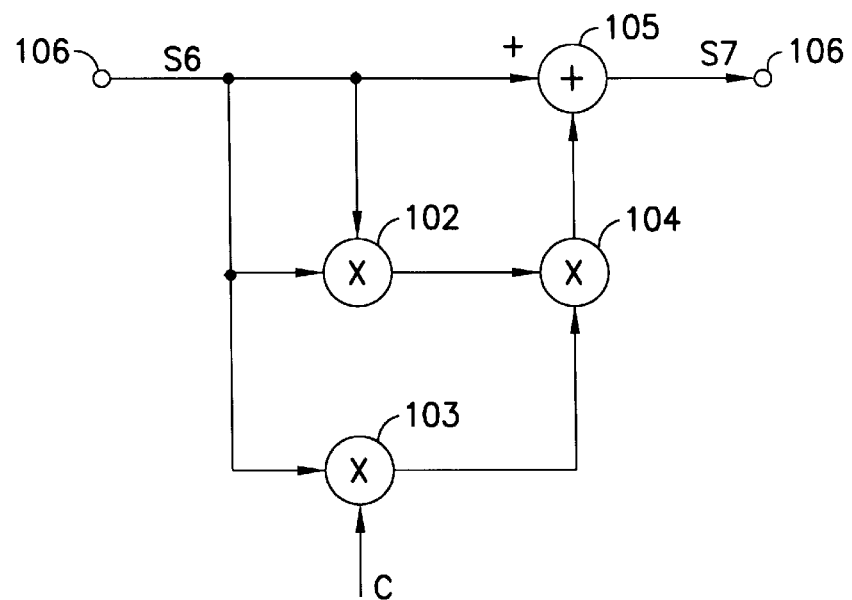
FIG. 7 illustrates circuitry for calculating a tangent according to an embodiment of the present invention.

FIG. 7 illustrates details of the circuit 81 illustrated in FIG. 5 and employed to construct the tangent to signal S6 by means of a first-order Taylor's series. Signal S6 enters through an input terminal 101 and is multiplied by itself in a multiplier 102 and by a constant c in another multiplier 103. The products are then multiplied together in still another multiplier 104, resulting in a coefficient of the third order. This coefficient is added to signal S6 in an adder 105. The sum, signal S7, leaves through an output terminal 106.

Figure 8:
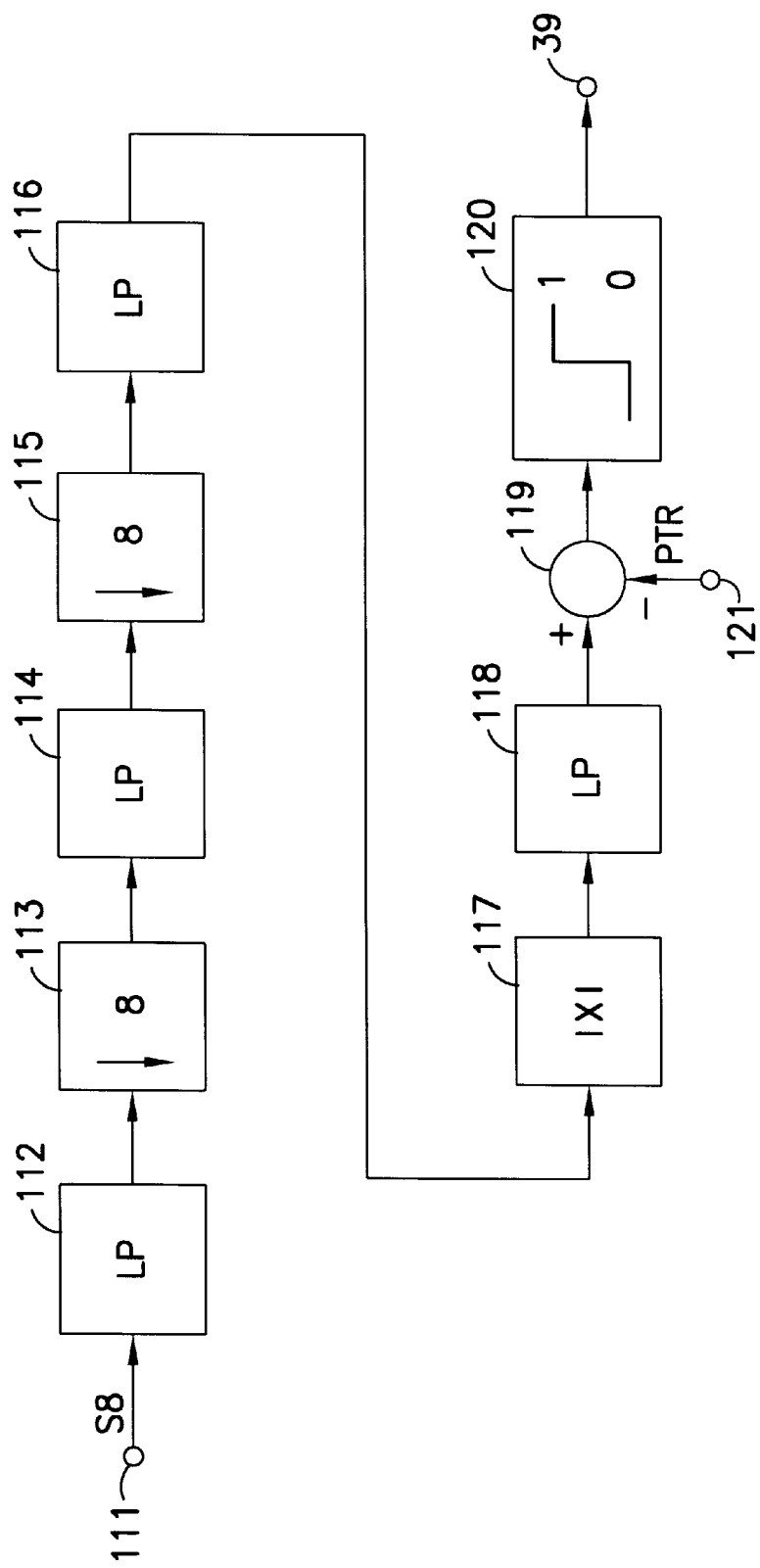
FIG. 8 illustrates a pilot-tone filter for sampling a 25-Hz pilot tone according to an embodiment of the present invention.

FIG. 8 is a detailed illustration of the pilot-tone filter 87 illustrated in FIG. 5. Signal S8 enters through an input terminal 111 and is filtered through a low-pass filter 112. Its scanning rate is reduced in a decimator 113. It is filtered in another low-pass filter 114 and its scanning rate reduced again in another decimator 115. The signal then travels through still another low-pass filter 116. The pilot tone is now very narrow-band. Disturbance from any residual direct component of the difference signal or from the difference signal itself are accordingly impossible. Filters 112 and 114 are both comb filters.

To determine the level of the pilot tone, the magnitude of the filtered pilot tone is obtained and low-pass filtered through a second-order IIR filter 118. A threshold PTR is introduced through an input terminal 121. The level of the pilot tone is compared with threshold PTR by means of a subtractor 119 and an immediately downstream threshold circuit 120. The threshold can be programmed by the (equipment) processor that controls the whole receiver. If the threshold is exceeded, a pilot tone is recognized and the pilot-tone indicator (the signal leaving through output terminal 39) set to read "1". Otherwise the indicator will read "0". The pilot-tone indicator will inform the equipment processor when a stereophonic broadcast is being received.

FIG. 9 is a detailed illustration of the frequency-correction circuit 78 illustrated in FIG. 5. It corrects the center-frequency errors that occur because the receiver in accordance with the present invention is tuned to a reference frequency obtained from a quartz timer and accordingly does not usually precisely match the transmitter's unmodulated carrier frequency.

How the center-frequency error is corrected will now be specified. Phase signal P enters through an input terminal 124 and a frequency-proportional signal S1 is derived therefrom. The phase signal is for this purpose delayed one sampling period in a delay stage 125, and the original phase signal is the original phase signal is and subtracted from the delayed phase signal. Since the phase is limited in arithmetic stage 45 to an angular range of −π to +π, or of −1≦ phase/π≦=1−1 LSB for a standardized display, angular differences (or sums) outside of that range must be corrected by 2π or 2. Overflow of this type is called wraparound and is similar to modular arithmetic. It can easily be carried out in an arithmetic stage. The adders 126, 127, and 128 that carry out these operations are represented in FIG. 9 by concentric circles in contrast to adders like those illustrated in FIG. 4 that become saturated in the event of overflow.

Alternating components are removed from the frequency-proportional signal S1 in a low-pass filter 129, resulting in a signal S2. Direct component S2 is integrated in a modular adder 127 and delayed one sampling period by a delay stage 130, resulting in a signal S3. Signal S3 describes the phase error resulting from frequency offset with the exception of a constant phase error. The constant error is subtracted from phase signal P in a subtractor 128. The corrected signal S4a leaves through output terminal 131 for the circuit 79 illustrated in FIG. 5.

Angle-representation signal S4a enters the circuit illustrated in FIG. 10 through input terminal 134. A modular adder 135 adds a Skorr signal with a value of either π or 0. The corrected signal S4 leaves through output terminal 136. The correction value is π when the mean magnitude signal exceeds a prescribed angle c2. The correction is canceled once the signal that has exceeded angle c2 returns to an angle of less than angle c1. The resulting hysteresis prevents the Skorr signal from insistently alternating between 0 and π. The signal's sampling rate is reduced by a factor of 8 in a decimator 137. A magnitude signal is constructed in stage 138 and forwarded through a first-order IIR low-pass filter 139.

The aforesaid hysteresis is introduced in stage 140 with thresholds c1 and c2.

The phase error left in signal S4 downstream of the correction circuit 79 illustrated in FIG. 5 is corrected by means of the circuit 80 illustrated in FIG. 11. The signal enters through input terminal 141 and is forwarded to a modular adder 142 in the order and to a low-pass filter 143. The low-pass filtered signal S5 is subtracted from signal S4, leaving a corrected signal S6 at output terminal 144. Like the low-pass filter 129 illustrated in FIG. 9, low-pass filter 143 can be in the form of the circuit illustrated in FIG. 6.

Figure 12:
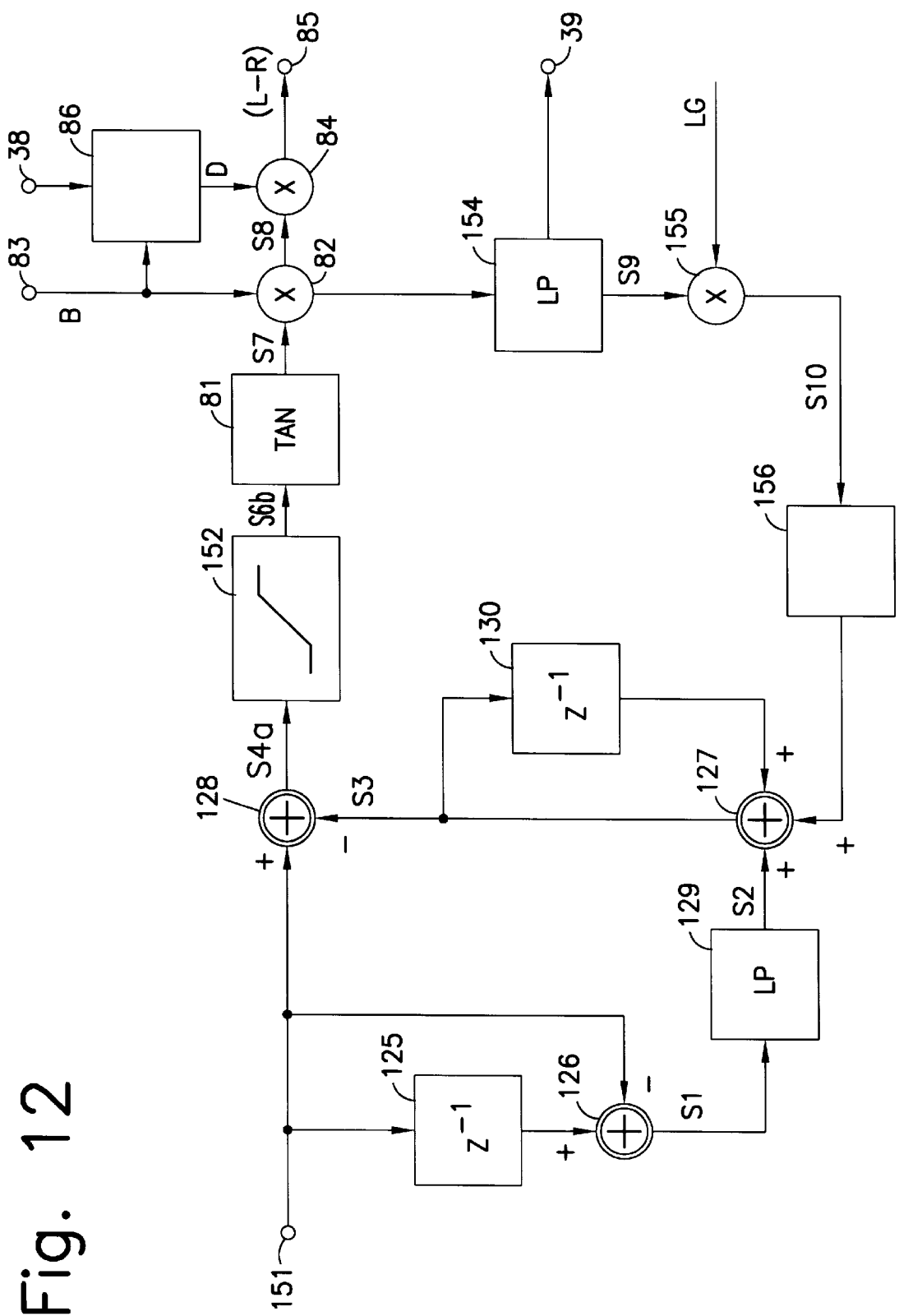
FIG. 12 illustrates a circuit for decoding the phase signal according to one embodiment of the present invention.

FIG. 12 illustrates another version of the Q decoder 48 illustrated in FIG. 3. It is distinguished by a particularly low signal-to-noise ratio in difference channel L–R. Phase signal P enters through input terminal 151. Its frequency is corrected as in the Q decoder illustrated in FIG. 5 and as specified with reference to FIG. 9 by means of modular adders 126, 127, and 128, delay stages 125 and 130, and low-pass filter 129. The frequency-corrected signal S4b is routed through a limiter 152. The limited signal S6b is processed as previously specified with reference to FIG. 5, by means of a tangent generating circuit 81, multipliers 82 and 84, and a circuit 86. Circuit 86 generates a signal D that characterizes signal quality. The pilot-tone indicator at output terminal 39 is derived in the circuitry illustrated in FIG. 12 by means of a low-pass filter 154. The signal S9 leaving filter 154 is multiplied by a constant in a multiplier 155. Multiplier 155 can be programmed by an equipment processor for example. The resulting signal S10 is entered in a register 156. It is read out of the register at a higher rate and forwarded to a modular adder 127. If the phase error between the unmodulated carrier signal and signal S3 is 0, signal S8 and hence signal S9 and even signal S10 will have no direct component. Otherwise, the feedback in the direct component will vary the phase of signal S3 until the phase error and hence the direct component of signal S8 disappear. A constant LG dictates the loop amplification in this form of regulation.

The circuit specified with reference to FIG. 12 does not need π correction because limiter 152 becomes active when there is an angular offset of π in signal S4a, which leads to a high direct component in signal S8. The feedback will accordingly phase-shift signal S3 until the offset and hence direct component S8 as well are completely compensated. The essential advantage of this circuit over the circuit illustrated in FIG. 5 is that the direct component of signal S8 and not that of signal S4 is measured for purposes of phase correction. The direct component of signal S8 depends entirely on the phase error being sought, whereas the direct component of S4 is to some extent modulation-dependent as well. The aforesaid advantages of the receiver in accordance with the present invention, specifically that the reference frequency need not be coupled to the frequency of the unmodulated transmission carrier and that the frequency is corrected by open loop controls and not by closed loop control (PLL), are still present.

Figure 13:
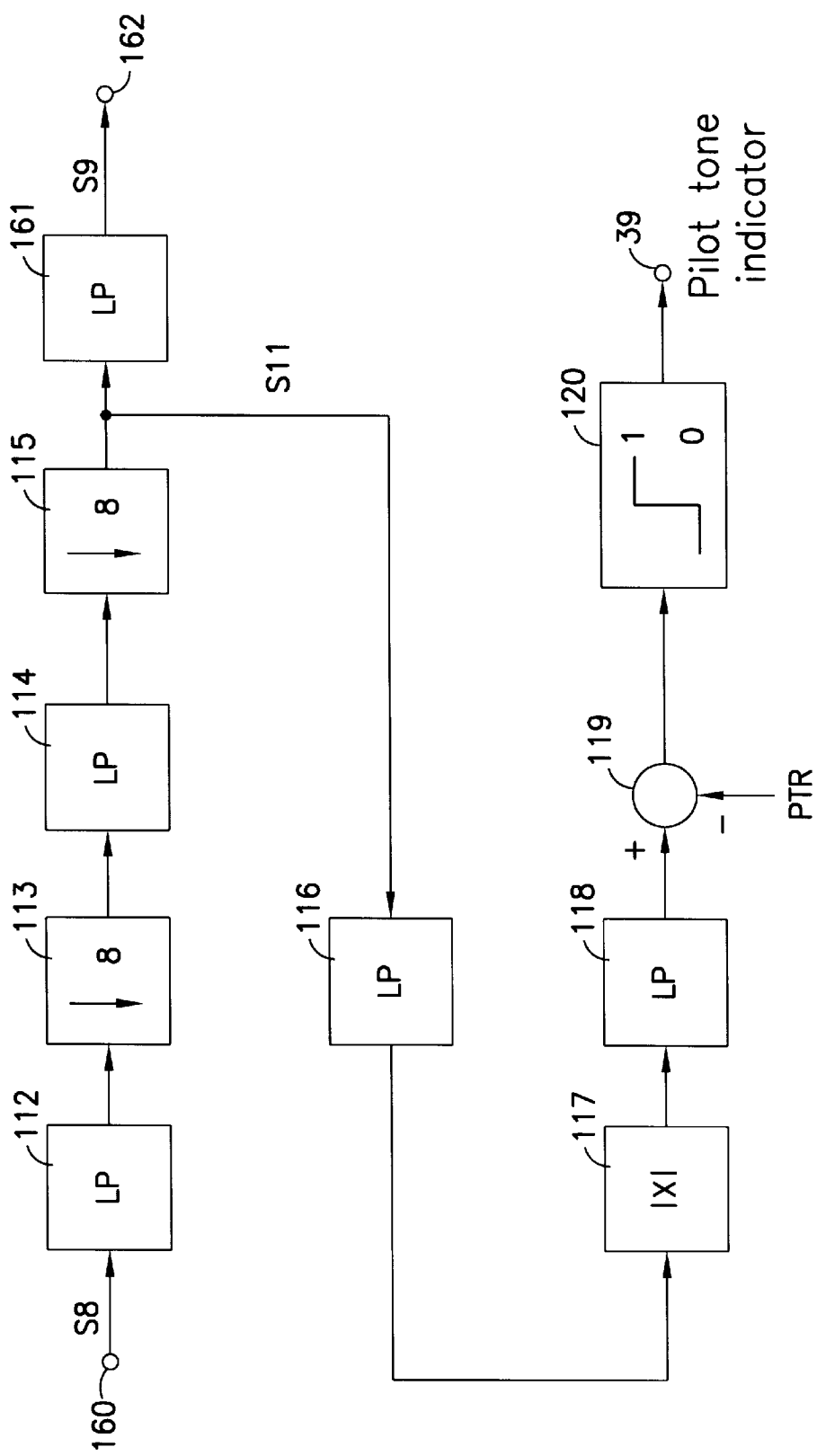
FIG. 13 illustrates a low-pass filter according to the present invention.

FIG. 13 is a detailed illustration of the low-pass filter 154 illustrated in FIG. 12 and employed to generate signal S9 as well as to derive a pilot-tone indicator. Signal S8 enters by way of input terminal 160 and is low-pass filtered and its sampling rate reduced twice by components 112 through 115. The pilot-tone indicator is again derived as in the circuit illustrated in FIG. 8. The signal leaving decimator 115 is forwarded through a low-pass filter 161, and the resulting signal leaves the circuit through output terminal 162.

What is claimed:

1. A method for demodulating a quadrature-amplitude modulated stereo signal for radio receivers, comprising the steps of:

constructing a digital intermediate-frequency signal from a received first signal;

converting the digital intermediate-frequency signal into a baseband signal having a first orthogonal component and a second orthogonal component;

computing a magnitude signal and a phase signal as a function of the first orthogonal component and the second orthogonal component; and constructing a tangent signal as a function of the phase signal; and multiplying the tangent signal and the magnitude signal to generate a stereo difference signal.

2. The method according to claim 1, further comprising the step of, prior to constructing the tangent signal, correcting the phase signal when a deviation exists in at least one of a frequency and a phase of the digital intermediate frequency signal.

3. A method for demodulating a quadrature-amplitude modulated stereo signal for radio receivers, comprising the steps of:

constructing a digital intermediate-frequency signal from a received first signal;

converting the digital intermediate-frequency signal into a baseband signal having a first orthogonal component and a second orthogonal component;

computing a magnitude signal and a phase signal as a function of the first orthogonal component and the second orthogonal component;

constructing a tangent signal as a function of the phase signal;

prior to constructing the tangent signal, correcting the phase signal when a deviation exists in at least one of a frequency and a phase of the digital intermediate frequency signal; and multiplying the tangent signal and the magnitude signal to generate a stereo difference signal, wherein when a frequency deviation exists in the digital intermediate frequency signal, the correcting step includes:

computing a variation signal over time for the phase signal;

low pass filtering the variation signal to compute a low pass filtered variation signal;

integrating the low pass filtered variation signal to compute a first correction signal; and subtracting the first correction signal from the phase signal to compute a first corrected phase signal.

4. The method according to claim 3, further comprising the steps of:
  low pass filtering the first corrected phase signal to compute a second correction signal; and
  subtracting the second correction signal from the first corrected phase signal to compute a second corrected phase signal.

5. The method according to claim 3, further comprising the steps of:
  computing a magnitude signal of the first corrected phase signal;
  computing a low pass filtered magnitude signal by low pass filtering the magnitude signal of the first corrected phase signal;
  computing a Skorr signal as a function of the low pass filtered magnitude signal via a downstream threshold circuit supplying hysterisis wherein the Skorr signal has one of a first level and a second level; and
  adding the Skorr signal to the first corrected phase signal to produce a third corrected phase signal.

6. The method according to claim 5, wherein the first level and the second level differ by $\pi$ and correspond to a phase deviation.

7. The method according to claim 6, wherein:
  the first level corresponds to zero, the second level corresponds to $\pi$, the Skorr signal initially has the first level, the Skorr signal is set to the second level when the low pass filtered magnitude signal attains a value greater than a first angle, and the Skorr signal is reset to the first level when the low pass filtered magnitude signal attains a value less than a second angle.

8. The method of claim 3, further comprising the steps of:
  low pass filtering the stereo difference signal to produce a feedback signal;
  adding the feedback signal to the low pass filtered variation signal to produce a second signal;
  passing the first corrected phase signal through a limiter to produce a limited first corrected phase signal; and
  constructing a second tangent signal as a function of the limited first corrected phase signal.

* * * * *